US005210639A

United States Patent [19]

Redwine et al.

[11] Patent Number: 5,210,639

[45] Date of Patent: May 11, 1993

[54] DUAL-PORT MEMORY WITH INHIBITED RANDOM ACCESS DURING TRANSFER CYCLES WITH SERIAL ACCESS

[75] Inventors: Donald J. Redwine, Houston; Raymond Pinkham, Stafford, both of Tex.

[73] Assignee: Texas Instruments, Inc., Dallas, Tex.

[21] Appl. No.: 870,721

[22] Filed: Apr. 10, 1992

Related U.S. Application Data

[60] Continuation of Ser. No. 630,407, Dec. 19, 1990, abandoned, which is a continuation of Ser. No. 534,297, Jun. 5, 1990, abandoned, which is a continuation of Ser. No. 285,434, Dec. 16, 1988, abandoned, which is a division of Ser. No. 64,290, Jun. 18, 1987, Pat. No. 4,897,818, which is a division of Ser. No. 567,039, Dec. 30, 1983, Pat. No. 4,689,741.

[51] Int. Cl.[5] ........ G11C 19/00; G11C 7/00

[52] U.S. Cl. ........ 395/425; 395/164; 364/244.8; 364/DIG. 1; 364/244.1

[58] Field of Search ........ 395/425, 164

[56] References Cited

U.S. PATENT DOCUMENTS 3,869,603 3/1975 Auspurg et al. ........ 371/21
4,023,142 5/1977 Woessner ........ 364/200
4,417,304 11/1983 Dinwiddie ........ 364/200
4,541,075 9/1985 Dill ........ 365/189.04

OTHER PUBLICATIONS

*IBM Technical Disclosure Bulletin*, vol. 23, No. 8, Jan. 1981, "All Points-Addressable Raster Scan Graphics for Cathode Raytube with Dual-Ported Bit Map", pp. 3553-3555.

*Analysis and Design of Digital Integrated Circuits*, by Hodges, et al., Copyright to 1983, pp. 359-397.

*Primary Examiner*—Lawrence E. Anderson
*Attorney, Agent, or Firm*—Richard L. Donaldson; Leo N. Heiting; Richard B. Havill

[57] ABSTRACT

In a video computer system having a dual-port bit-mapped RAM unit incorporating a shift register, provision is made for coupling data between column lines and the shift register, and for simultaneously preventing any column line from being coupled with the random data output terminal of the RAM unit. Accordingly, this prevents two or more different data bits from appearing simultaneously from the RAM unit and causing confusion as to which is the valid signal and which is a spurious signal.

15 Claims, 8 Drawing Sheets

DUAL-PORT MEMORY WITH INHIBITED RANDOM ACCESS DURING TRANSFER CYCLES WITH SERIAL ACCESS

This is a Continuation of application Ser. No. 630,407, filed Dec. 19, 1990, now abandoned, which is a Continuation of application Ser. No. 534,297, filed Jun. 5, 1990 now abandoned; which is a Continuation of application Ser. No. 285,434, filed Dec. 16, 1988, now abandoned; which is a Division of application Ser. No. 064,290, filed, Jun. 18, 1987 now U.S. Pat. No. 4,897,818; which is a Division of application Ser. No. 567,039, filed Dec. 30, 1983, now U.S. Pat. No. 4,689,741.

This application contains subject matter disclosed in U.S. Pat. Nos. 4,639,890 issued Jan. 27, 1987, 4,663,735 issued May 5, 1987, 4,747,081 issued May 24, 1988, 4,688,197 issued Aug. 18, 1987, and 4,720,819 issued Jan. 19, 1988 all filed Dec. 30, 1983 and assigned to Texas Instruments Incorporated.

BACKGROUND OF THE INVENTION

This invention relates to methods and apparatus for deriving valid data signals in a video computer and the like, and more particularly relates to improved methods and apparatus for preventing the transfer of spurious or invalid signals from the video storage circuit to the microprocessor and the like.

It is conventional, in a video computer system, to employ a data storage circuit comprising a RAM chip having a serial shift register. In such an arrangement, the microprocessor is programmed to generate row and column address signals to establish the RAM chip in a parallel mode, and thereafter to generate appropriate "read" and transfer signals to transfer the selected data to the parallel output terminal of the storage circuit. Similarly, the RAM chip is established in the serial mode by the transfer and row address signals, and the selected data is then transferred to the shift register in response to the "read" signal. Thereafter, a clocking signal from the microprocessor may be used to clock out the data from the shift register to the serial output terminal of the storage circuit.

Data bits on the serial output terminal are directed to the CRT circuit for producing a video image. However, data bits at the parallel output terminal are intended to be redelivered to the microprocessor for use in the selected program. Accordingly, it is essential to the purposes of the microprocessor that it receive only valid and not spurious signals from the parallel output terminal of the data storage circuit.

It should be noted, however, that in a system of the type described in said U.S. Pat. No. 4,663,735, after data is transferred to the parallel output terminal in response to the "read" and transfer signals, another row address signal may appear before the transfer signal has been discontinued by the microprocessor. As hereinbefore indicated, this simulates the condition wherein the RAM chip is in the serial mode, and if a "write" signal also happens to occur or be present at this time, the effect is that data in the shift register may be transferred into the particular memory cell from which data has just previously been transferred to the parallel output terminal. Since the RAM chip is actually in the parallel mode, however, there is a likelihood that this unwanted or spurious data will not lodge in the cell of interest, but will also appear at the parallel output terminal at or about the same time as the valid data of interest.

These disadvantages in the prior art are overcome by the present invention, and improved methods and apparatus for covering stored data signals are provided, which not only deliver valid signals to the microprocessor, but which prevent any unwanted or spurious signal from being delivered to the parallel output terminal at about the same time.

SUMMARY OF INVENTION

It is within the concept of the present invention to provide means and methods of blocking the flow or transfer of data to the parallel output terminal whenever the shift register is coupled to the columns of cells in the RAM chip. In this way, spurious or otherwise unwanted data cannot be delivered from the shift register to the parallel output terminal at or about the same time valid data is present or is sought to be taken from the parallel output terminal.

In a preferred embodiment of the present invention, the result is achieved by including an internal control circuit having its inputs coupled to receive both the transfer signal and the row address signal. Accordingly, wherever both of these signals appear substantially concurrently, the circuit generates an output signal which is used to block the parallel output terminal from receiving any data signals from any of the cells in the RAM chips.

There are, of course, different techniques and arrangements for achieving this objective. However, a preferred arrangement contemplates the interposition of a buffer circuit between the outputs of the sensing amplifiers and the parallel output terminal. The buffer circuit may be arranged to be directly responsive to the row address and transfer signals being generated by the microprocessor, or it may be arranged and adapted to respond to the output of an intermediate circuit, such as the internal control circuit hereinbefore mentioned, which is itself interconnected to receive these two signals from the microprocessor.

Accordingly, it is an object of the present invention to provide means and methods for regulating the transfer of data signals between the storage circuit and the microprocessor.

It is another object of the present invention to provide improved methods and apparatus for transferring only valid video data signals to the microprocessor from the video storage circuit.

It is also an object of the present invention to provide improved methods and apparatus for blocking invalid signals from the parallel output terminal of a video storage circuit in a computer and the like.

It is further a specific object of the present invention to provide in a video computer system having a microprocessor and the like for generating row address and transfer signals, the improvement comprising, data storage means having a plurality of data memory cells functionally arranged in rows and columns selectably interconnectable with parallel and serial output terminals, and control means responsive to said signals for blocking data transfer between said parallel output terminal and said microprocessor and the like.

It is also another specific object of the present invention to provide a method of deriving valid data signals in a video computer system having a plurality of memory cells functionally arranged in rows and columns interconnectable with parallel and serial output terminals, comprising generating a plurality of address and transfer signals in said system, selecting and transferring data from one of said cells to said parallel output terminal as a function of said address signal, and blocking said transfer of data to said parallel output terminal as a function of said transfer signal.

These and other objects and features of the present invention will become apparent from the following detailed description, wherein reference is made to the figures in the accompanying drawings.

IN THE DRAWINGS

DETAILED DESCRIPTION OF SPECIFIC EMBODIMENT

Figure 1:
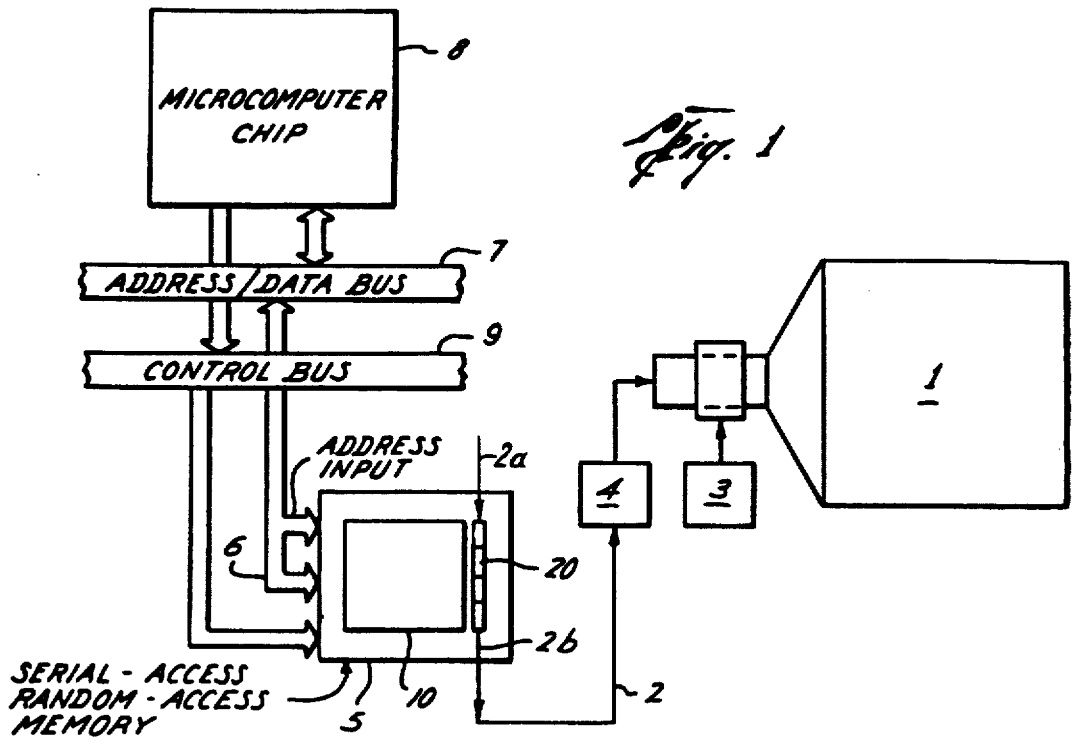
FIG. 1 is a simplified block diagram of a computer system embodying one form of the present invention.

Referring to FIG. 1, there may be seen a simplified representation of the components of a computer video system which employs a dual port bit-mapped memory arrangement according to one embodiment of the invention. More particularly, there may be seen a video display section 1 having a conventional raster-scanned CRT tube responsive to a video signal input 2 consisting of serial bits of data arriving at a rate of about 20 MHz or greater.

The standard TV signal normally provides 60 data frames per second, with 512 interlaced lines per frame, and each such line may have several hundred dots or pixels. The product of these numbers indicates that data bits must be supplied to the CRT at frequencies of the order of 20 MHz. For a simple black and white picture, each dot or pixel can be defined by one data bit, but up to four bits may be required for images in a more realistic sixteen shades of gray. A full-color image may require three or four streams or planes of data and usually will require at least one byte (8-bits) per pixel.

The horizontal and vertical scanning and synchronizing circuitry 3 and video signal shaping circuitry 4 may be of a conventional design, and are not a functional part of the present invention. In addition, the circuitry depicted in FIG. 1 may also include a complete TV monitor or receiver as needed. However, the video data on input 2 is preferably received from a bit-mapped video memory 5 as will be described later herein, and this memory 5 will preferably have at least one cell for each corresponding pixel on the video screen 1. The memory 5 may conveniently have a "parallel" or random input/output port 6, or it may have separate parallel input and output ports, in addition to the serial input port 2a and serial output port 2b depicted in FIG. 1. In addition, port 6 is preferably coupled to a multiplexed address/data input/output bus 7 of a suitable microcomputer or microprocessor 8.

Referring again to FIG. 1, it will be noted that the memory 5 receives addresses appearing on the bus 7, to define the address for the serial ports 2a and 2b, and also to define addresses for writing into or reading from the memory 5, by way of the parallel or random port 6. A control bus 9 coupling the microcomputer 8 to the memory 5 provides the basic clock frequency signal $\phi$ which clocks the serial video data onto the CRT input line 2, and which also provides the memory control signals such as Address Latch, Row Address Strobe ($\overline{RAS}$), Column Address Strobe ($\overline{CAS}$), Serial Select, Serial Output Enable ($\overline{SOE}$), Write Enable, Write ($\overline{W}$), Increment (INC), etc., as may be required because of the characteristics of both the memory device 5 and microcomputer 8.

The memory 5 further includes a memory or storage array 10 composed of rows and columns of memory cells partitioned according to the size and type of video display 1 and the type of memory 5 which has been chosen. In addition, the memory 5 further includes a serial shift register 20 having a plurality of taps. In this regard, it will be noted that a standard two-level black and white TV raster conventionally requires about 512 rows of cells (for 512 lines) arranged in 512 columns (for 512 pixels per line), to accommodate a total of 256K-bits of memory per complete data frame. Accordingly, if 64K memory devices are used for these purposes, then four such units will be required to form the memory 5, or else one 256K-bit memory device may be used instead. These four units may alternate in feeding 256-bit blocks of video data serially onto the line 2, or other formats may be employed as appropriate. A black and white image having relatively low resolution may be produced using only one 64K-bit storage array capable of providing 256 lines by 256 pixels per line.

Figure 2:
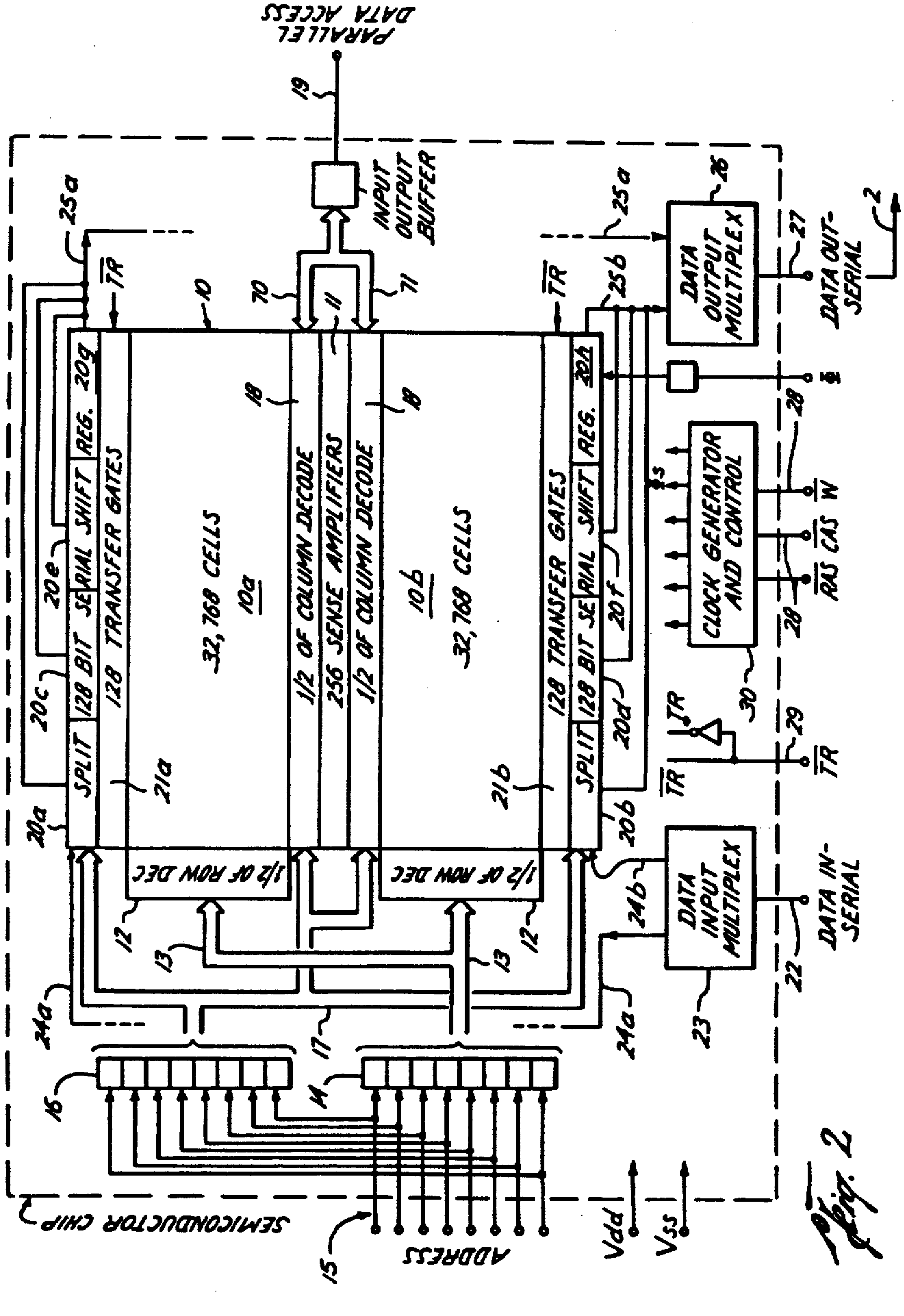
FIG. 2 is a more detailed block diagram of a selected portion of the computer system depicted in FIG. 1.

One example of a memory device 5 which may be suitable for use in the system depicted in FIG. 1 and depicted in FIG. 2, is a 64K-bit MOS dynamic read/write memory using one transistor cells, as shown in U.S. Pat. No. 4,239,993, and further including a serial shift register having multiple taps added. For this example, the random access may be one bit wide. Other suitable examples (not shown) may be memory devices as hereinbefore described which have 256K-bits of storage or even larger.

As hereinafter set forth, if the memory is partitioned to provide eight chips, for example, then the individual storage devices may be X1, i.e. one bit wide, and eight of these storages may be connected in parallel for access by a typical 8-bit microcomputer 8. Other partitioning, such as X4 or X8, could also be employed as will hereinafter be apparent.

The memory device 5 depicted in FIG. 2 is typically made by an N-channel, self aligned, silicon gate, double-level polysilicon, MOS process, with all of the device being included in one silicon chip of about 1/30 of a square inch in size, which usually would be mounted in a standard dual in-line package having twenty pins or terminals. For a 256K-bit device this package may be provided with as many as twenty two pins or terminals. Similarly, the number of the pins would increase for larger volume devices. The device includes in this example an array 10 split into two halves 10*a* and 10*b* of 32,768 cells each, in a regular pattern of 256 rows and 256 columns. Of the 256 rows or X lines, there are 128 in the array half 10*a* and 128 in the half 10*b*. The 256 columns or Y lines are each split in half with one-half being in each of the halves 10*a* and 10*b*. There are 256 sense amplifiers 11 in the center of the array; these are differential type bistable circuits made according to the invention disclosed and claimed in said U.S. Pat. Nos. 4,239,993, or in 4,081,701. Each sense amplifier is connected in the center of a column line, so 128 memory cells are connected to each side of each sense amplifier by a column line half. The chip requires only a single 5 V supply $V_{dd}$, along with a ground terminal $V_{ss}$.

A row or X address decoder 12, split into two halves, is connected by sixteen lines 13 to eight address buffers or latches 14. The buffers 14 are made according to the invention disclosed in U S. Pat. No. 4,288,706. An eight-bit X address is applied to inputs of the address buffers 14 by eight address input terminals 15. The X decoder 12 functions to select one of the 256 row lines as defined by an eight bit address on the input terminals 15 received via bus 7 from the microcomputer 8. For more than 256 row lines, i.e. a 256K-bit memory with 512 row lines, a larger than eight-bit X address and latch must be employed.

Figure 3:
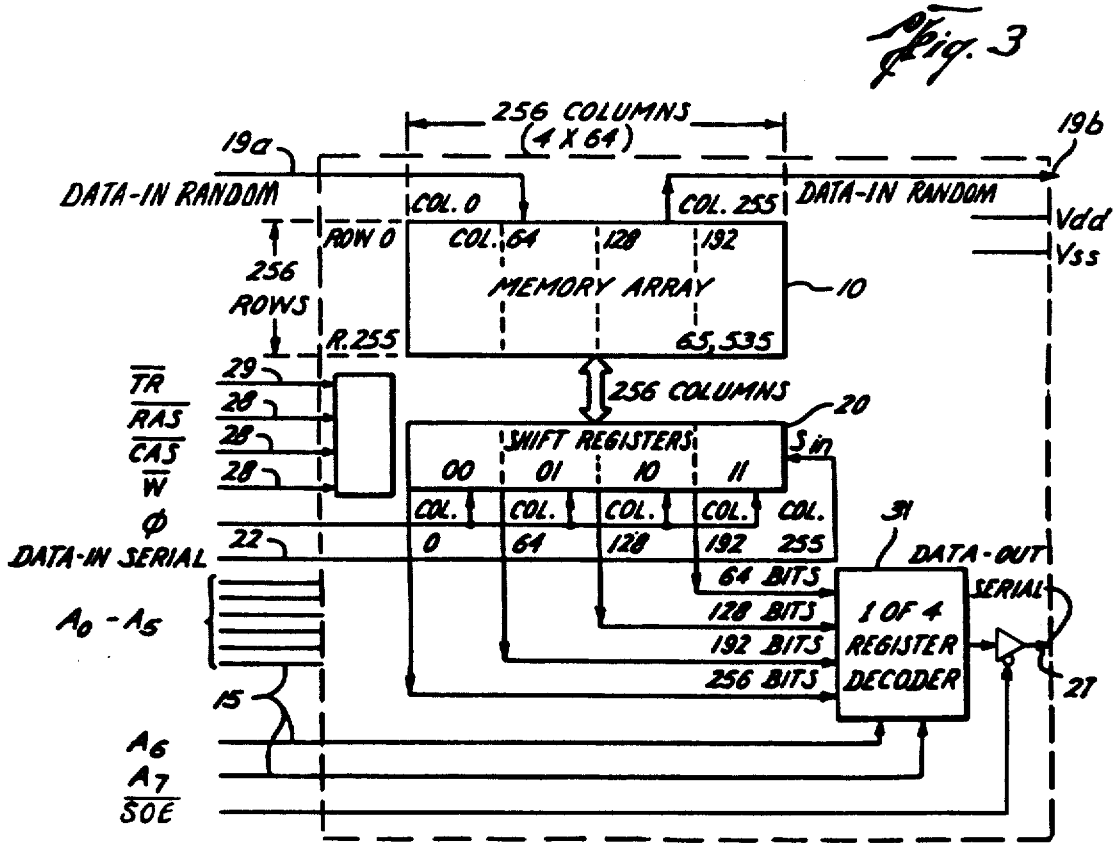
FIG. 3 is another different block diagram of the apparatus depicted FIG. 2.

A column address is also received on the input pins 15 and latched into column address latches 16. For a bit-wide random-access data input/output, all eight column address bits are needed, but for byte wide access, i.e. eight bits, only five address bits are needed, and the microcomputer may output additional column address bits to select among several cascaded chips; these additional column address bits may be used by chip-select decoders of conventional construction. The outputs of the column address latches 16 are connected by lines 17 to a decoder 18 in the center of the array which selects one-of-256 columns to produce a bit wide input/output on random access input/output line 19; separate input 19*a* and output 19*b* lines may be used as shown in FIG. 3, or the line 19 may be multiplexed as shown in FIG. 2. Rows of dummy cells (not shown) are included on each side of the sense amplifiers as is the usual practice in devices of this type. As for the Y-address, for larger volume devices, the number of bits and latches required to identify a column increases.

The memory device is thus similar to a standard dynamic RAM, with bit-wide or other bit-size random access and also having a serial input/output. Continuing to refer to FIG. 2, the serial access is provided by a 256-bit serial shift register 20 split into two identical halves with the halves positioned at opposite sides of the array 10. The same result may be achieved by placing both halves on the same side of the array, but laid out one above the other.

The serial shift register 20 may be loaded from the column lines of the array 10 for a read cycle, or loaded into the column lines for a write cycle, by 128 transfer gates 21*a* on one side of the array and a like number of transfer gates 21*b* on the other side of the array.

Data input to the device for serial write is by a data-in terminal 22 (2*a* of FIG. 1) which is connected by a multiplex circuit 23 to inputs 24*a* and 24*b* of the serial shift register halves. Data is read out serially from the register halves via outputs 25*a* and 25*b*, a data-out multiplex and buffer circuit 26, and a data-out terminal 27 (2*b* of FIG. 1). The data-out multiplex and buffer circuit 26 controls whether the data appears at the output terminal 27 in response to a control signal, Serial Output Enable ($\overline{SOE}$), on control pin 28.

The serial shift register 20 is operated by a clock $\phi$ which is used to shift the bits through the stages of the register, two stages for each clock cycle. For read operations it takes only 128 cycles of the clock $\phi$ to output 256 bits from the 256 bit positions of the split serial shift register. A control signal $\overline{TR}$, on lead 29 and applied to the transfer gates 21*a* and 21*b* connects each of the 256 bit positions of the serial shift register 20 to its corresponding column line in the array halves 10*a* and 10*b*. This same control signal $\overline{TR}$ on lead 29 performs the additional function of controlling the availability of selected random data on the random output terminal 19*b* (See FIG. 3), as discussed later herein. This allows for multiplexing both the data input and output busses with the address bus to reduce interconnecting circuitry in a video computer system and the like, and thereby reduce costs for such a system and improve its reliability.

In a serial write operation, the sense amplifiers 11 are operated by a write command, $\overline{W}$, occurring after $\overline{TR}$ to set the column lines at a full logic level, after which one row line is selected by the address in the latches 14 and the data forced into the memory cells of this row.

A serial read cycle starts with an address on the input pins 15 which is decoded to activate one of the 256 X or row address lines (and a dummy cell on the opposite side). The sense amplifiers 11 are then actuated by a control signal from clock generator and control circuitry 30 to force the column lines to a full logic level, and then the transfer gates 21*a* and 21*b* are actuated by control signal $\overline{TR}$ to move the 256 bits from the selected row into the corresponding serial shift register 20 halves. According to the present invention, during a transfer of data between the shift register and the array, the random output line 19*b* (see FIG. 3) is blocked from the array by input/output buffer 41 internal control signals generated by clock generator and control circuitry 30 in response to external control signals, as discussed later herein. The shift clock signal $\phi$ is then applied and may move 256 bits onto the output pin 27 in serial format via the multiplex circuit 26 when $\overline{SOE}$ is low, at two stages or bits per clock cycle, requiring 128 clock cycles for the entire serial shift register. The output pin 27 is connected to the video input 2 of FIG. 1.

In view of the foregoing discussion of the shift clock rate, it is obvious that the serial shift register 20 also can operate at half the described rate and take 256 clock cycles to input or output 256 bits of data.

The memory device is thus similar to a standard dynamic RAM with a bit-wide or other bit-size random access with a serial input and output; the 256-bit serial shift register 20, which provides the serial input and output, is organized as four 64-bit serial shift registers.

One, two, three or four 64-bit serial shift registers may be accessed depending upon which of the four "taps" along the 256-bit serial shift register is selected. Since the 256-bit serial shift register is split into two "halves", each 64-bit serial shift register is also split into halves. As shown in FIG. 2, one 64-bit serial shift register includes top half 20*a* and bottom half 20*b*, a second 64-bit serial shift register includes top half 20*c* and bottom half 20*d*, a third 64-bit serial shift register includes top half 20*e* and bottom half 20*f*, and a fourth 64-bit serial shift register includes top half 20*g* and bottom half 20*h*.

The tap selected determines whether one, two, three or all four 64-bit serial shift registers are accessed. The tap selected is determined by a two bit code applied to the two most significant column address inputs. The depiction in FIG. 2 is thus made of lines 17 from the column address latch 16 also inputting to the serial shift register 20 to select, via the two bit binary code, the particular tap desired.

Referring now to FIG. 3, the selection of the tap and the operation of the four 64-bit serial shift registers may be clearly understood. The memory array 10 is there seen to be divided into four 64 column by 256 row arrays. The four sets of 64 columns correspond to the four 64-bit serial shift registers. It may also be clearly seen that this memory device operates as if it were two devices, i.e., a 256 rows by 256 columns, random access array 10, having a random input 19*a* and random output 19*b*, and an up to 256 by one array (i.e. the serial shift register 20) having a serial input 22 and serial output 27. It also clearly depicts the control signal $\overline{SOE}$ as capable of blocking data from serial output 27. This device allows access to the random array while serial data is being clocked into or out of one, two, three or four of the 64-bit serial shift registers. The 1 of 4 register decoder 31 of FIG. 3 may be of conventional construction. In this manner any bit of data may be accessed in 64 shifts or less, rather than 256 shifts. This may be of particular importance in other specific video applications.

Again, the tap selected is determined by a binary code, as illustrated in FIG. 3, which is applied to the two most significant column address inputs A6–A7. These inputs feed into the 1 of 4 register decoder 31 as shown in FIG. 3, to determine whether one, or two, or three or all four serial shift registers are accessed.

For example, if the two bits are both 0, then all 256 bits in the serial shift register may be shifted out. If the two bits are 01, then 192 bits, starting at bit 64, may be shifted out. If the two bits are 10, then 128 bits, starting at bit 128, may be shifted out. The two bit code 11, selects the last 64 bits starting at bit number 192 and then these last 64 bits may be shifted out.

In general, the number of bit positions between any two adjacent taps is a power of 2 that is less than and a different power of 2 from that power of 2 which equals the number of bit positions in the serial shift register. Further, these taps may be used in 512 rows by 512 columns or 1024 rows by 1024 columns, or larger devices having corresponding 512-bit or 1024-bit or larger serial shift registers in the manner described hereinbefore. Larger numbers of taps than four taps, will correspondingly require a larger register decoder and more inputs into the register decoder via the most significant column address lines, and conversely for fewer than four taps.

By use of these "taps" along the serial shift register it is possible to manufacture a 1024 rows by 1024 column (1M-bit) device that may be used with many different CRT screens, i.e., screens of various sizes (525 lines by 512 pixels per line, or 300 lines by 720 pixels per line), by merely employing the appropriate taps along the serial shift register of the device. Thus, all 1024 bits do not have to be shifted out of the register to obtain the desired data bits at the "end" of the register. Further, the taps could be located at bit positions of the register corresponding to the number of pixels per line in a "standard" CRT that does not correspond to a power of 2 position as described hereinabove.

Figure 4:
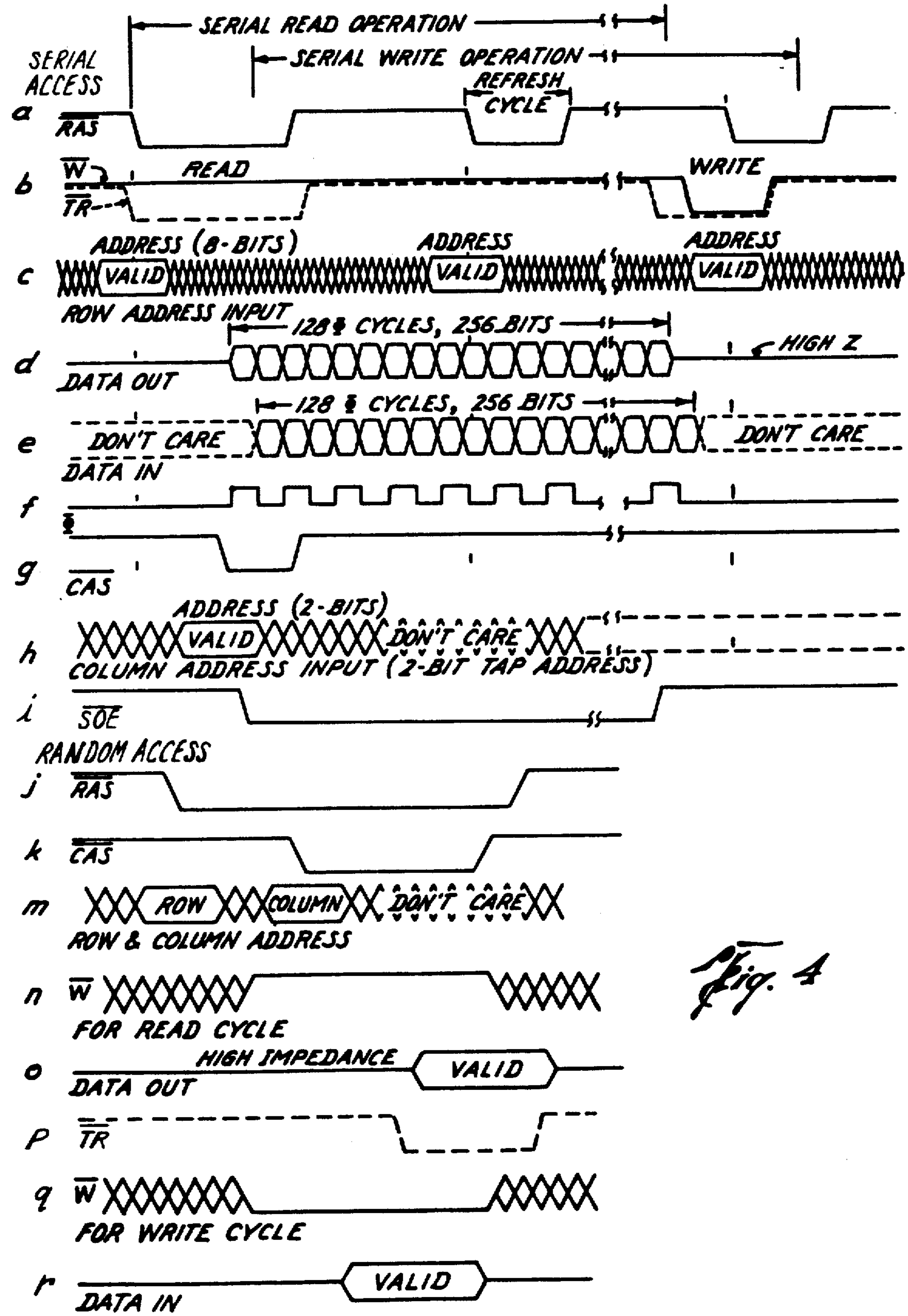
FIGS. 4a–4r are simplified time-dependent representations of certain signals generated for operation of the apparatus depicted in FIG. 2.

Referring now to FIGS. 2 and 4 for both serial access and random access, the X or row address must appear on the inputs 15 when a row address strobe $\overline{RAS}$, seen in FIGS. 4*a* and 4*j*, is applied to a control input 28. A column address strobe $\overline{CAS}$, as seen in FIGS. 4*g* and 4*k*, and a read/write control $\overline{W}$ as seen in FIGS. 4*b*, 4*n* and 4*q* are other controls 28 that may be employed during serial and random access to the device. These external control inputs 28 are applied to clock generator and control circuitry 30 which generates a number of clocks and internal chip control signals to control the operation of various parts of the device.

For example in serial access operations represented by the timing diagram of FIGS. 4*a* through 4*i*, when $\overline{RAS}$ goes low as seen in FIG. 4*a*, clocks derived from $\overline{RAS}$ cause the buffers 14 to accept and latch the eight row address bits then appearing on the input lines 15. The row address must be valid during the time period shown in FIG. 4*c*, i.e. during the falling edge of $\overline{RAS}$. Serial access is one of the functions of the device controlled by a $\overline{TR}$ command on control input 29. For a serial read operation, $\overline{TR}$ goes to active-low and the $\overline{W}$ signal is held high during the period seen in FIG. 4*b*, and the data output on the serial output terminal 27 will occur during the time period of 128 cycles seen in FIG. 4*d*, when $\overline{SOE}$ is held low as seen in FIG. 4*i*. For a serial write operation, the $\overline{TR}$ and $\overline{W}$ signals must both be active-low as also seen in FIG. 4*b* and the data-in bits must be valid during the preceding time period of 128 cycles seen in FIG. 4*e*.

Refresh occurs every time a row address appears on the inputs 15 and $\overline{RAS}$ goes low, as seen in FIG. 4*a* and 4*c*. Thus, during the 128 cycles when all four serial shift register halves are being read out through serial data-out pin 27, refresh can be occurring by loading a new row address into the chip 5 along with a $\overline{RAS}$ signal. The serial shift register is not disturbed so long as $\overline{TR}$ does not occur in coincidence with a $\overline{RAS}$ signal as described hereinabove. Serial data can be shifted into the register halves while data is being shifted out, and so a serial write operation can begin just after a serial read operation is initiated; although not needed in the system of FIG. 1, this feature is important for some other embodiments.

Parallel or random access occurs as illustrated in the timing diagram of FIGS. 4*j*–4*r*; note that these Figures are on an expanded time scale compared to FIGS. 4*a*–4*i*. The X or row address of FIG. 4*m* must appear on the inputs 15 when a row address strobe signal $\overline{RAS}$ of FIG. 4*j* is applied to an input 28. Likewise, the Y or column address of FIG. 4*m* must appear during a column address strobe signal $\overline{CAS}$ of FIG. 4*k* on another input 28. A read/write control $\overline{W}$ of FIGS. 4*n* and 4*q* on an input 28 is the other control signal for the parallel or random access. When $\overline{RAS}$ goes low as seen in FIG. 4*j*, clocks derived from $\overline{RAS}$ cause the buffers 14 to accept and latch the eight row address TTL-level bits then appearing on the input lines 15.

When $\overline{CAS}$ goes low as seen in FIG. 4*k* then clocks generated in the circuitry 30 cause the buffers 16 to latch the TTL-level column (or Y) address signals on the inputs 15. The row and column addresses must be valid during the time periods shown in FIG. 4*m*.

For a random access read cycle, the $\overline{W}$ signal on input 28 must be high during the period seen in FIG. 4*n*, and the output on the terminal 19 (see FIG. 4*o*) in response to the $\overline{TR}$ signal on lead 29 being low as seen in FIG. 4*p*. This allows one control signal $\overline{TR}$ on lead 29 to first select the operation of the device as either serial or random, and second to control the application of the selected data to the random output terminal when the device is in the random mode. This allows one control pin to perform two control functions and thereby minimize the need for additional pins for the device. Minimizing pin count in turn reduces the cost of the device and improves the reliability of the device; reliability decreases and cost increases as the number of pins increases because of the need to make additional connections from the silicon chip to its lead case terminals. Reliability further decreases with increased numbers of pins because as the number of pins increases the silicon chip size increases, which increases the probability of manufacturing a defective chip from dust particles on the chip. For a write-only cycle, the $\overline{W}$ signal must be low as seen in FIG. 4*q* and the input must be valid on terminal 19 during the time seen in FIG. 4*r*.

However, to ensure that no data appears on the random output terminal 19 during a register transfer operation, the random output/input buffer 41 blocks random data that may have been selected in a prior random mode from the output terminal 19. This buffer 41 blocks such data in response to an internal control signal generated by internal control circuitry 30 in response to the presence of both $\overline{TR}$ and $\overline{RAS}$ which control the transfer of data into or from the serial shift register 20. This blocking action prevents the inadvertent appearance of two different bits of data at the output terminal 19.

The memory device also may operate in a page mode format. That is, the row address is kept the same and successive column addresses are strobed onto the chip. By holding the row address the same, the time required to set up and strobe a new row address for the same page is eliminated and thus the time required for a page-mode operation is less than for a bit-mode format, as described hereinbefore. Typically, for the example device, a bit-mode operation requires about 260 nsec, whereas a page-mode operation requires only about 160 nsec.

Further, the serial shift register 20 may be employed to rapidly read data into the array 10. This may be accomplished by the microcomputer 8 generating the selected data bits and shifting these data bits serially into the serial shift register 20. These data bits are then written into one of the rows selected by the microcomputer 8 using an eight-bit row address signal and the row address strobe ($\overline{RAS}$) control signal as discussed hereinbefore. The data bits are then written into a second row selected by the microcomputer 8. This process of writing the data into rows continues until all of the rows contain the selected data bits.

This sequential writing of data from the shift register into all of the rows of the memory array is a particularly suitable process for initializing the data in the memory array to a known value (generally a "zero"). This process is useful for "powering up" the system to ensure only known data is read out of the array onto the CRT screen.

A modification of this process is for the microcomputer 8 to write the data into the individual cells of a selected row via a page-mode or bit-mode operation, and then transfer this data to the shift register. Once in the shift register it can then be sequentially written into the other rows as described hereinabove.

Either the modified or unmodified process allows for a much faster "clearing" or initialization of the memory array on "power-up", or as otherwise needed. This results from the writing of the data into a whole row of the array instead of the conventional process of writing the data into each individual cell, or each "cluster" of cells if in a byte or other bit-size system. The process is thus much faster than the conventional process for clearing the memory array.

The serial access via terminals 22 and 27 and serial shift register 20 is usually sequential in that the row address is incremented by one following each access. The video data is a continuous stream of 256-bit serial blocks, one after the other, so the next address for serial access, after the memory to shift register transfer occurs, will generally be the last row address plus one. In the simplest embodiment, the microcomputer 8 sends out the row addresses for serial read, so an address counter in the microcomputer 8 will be incremented after each serial read is commanded. However, this function may also be performed by special circuitry on the chip of FIG. 2.

In contrast, the parallel access via terminal 19 is random rather than sequential and specific row and column addresses must be generated in the microcomputer 8.

Thus, the timing of the $\overline{TR}$, $\overline{W}$, $\overline{CAS}$, and $\overline{RAS}$ signals is different for serial reads and writes, and random reads and writes. The voltages and timing of these control signals are seen in FIGS. 4*a*–4*i* for serial operations and 4*j*–4*r* for random operations. To load the serial shift register or transfer its contents into the array, $\overline{TR}$ must be low during the falling edge of $\overline{RAS}$.

If write command $\overline{W}$ is held high during the falling edge of $\overline{RAS}$ then data in the columns of the selected row will be moved into the register by the transfer gates 21. The two bit tap address, see FIG. 4*h*, appearing on the most significant column address lines A6 and A7 when $\overline{CAS}$ goes low, see FIG. 4*g*, determines which of the four cascaded 64-bit serial shift registers will be connected to serial output 27. The serial shift clock $\phi$, FIG. 4*f*, then shifts the data out of the serial shift register at the desired data rate in response to the frequency of the clock $\phi$, when $\overline{SOE}$ is low as seen in FIG. 4*i*.

Upon commencing a serial write operation, data on the data-in lead is shifted into and through the serial shift register in response to the clock $\phi$. If $\overline{W}$ is held low during the falling edge of $\overline{RAS}$, then data is transferred from the serial shift register to the array columns and into the row selected by the row address bits.

If $\overline{TR}$ is held high when $\overline{RAS}$ falls low then the serial shift register and array operate independent of each other, i.e., the serial shift register may shift data out or in and the array is available for random access. Further, while in the random mode, the $\overline{TR}$ signal controls the timing of the appearance of the selected data on the random output terminal. This allows for multiplexing of the data and address busses to reduce costs and improve reliability of a computer video system. Further random data is blocked from the random output terminal during any register transfer operations as discussed hereinbefore.

Thus the timing of $\overline{W}$ is different in the random access mode and the serial mode of operation of the memory device. More specifically, $\overline{W}$ is set up and held relative to the falling edge of $\overline{CAS}$ during a random access operation. However, $\overline{W}$ is set up and held relative to the falling edge of $\overline{RAS}$ during a serial access operation.

Figure 5:
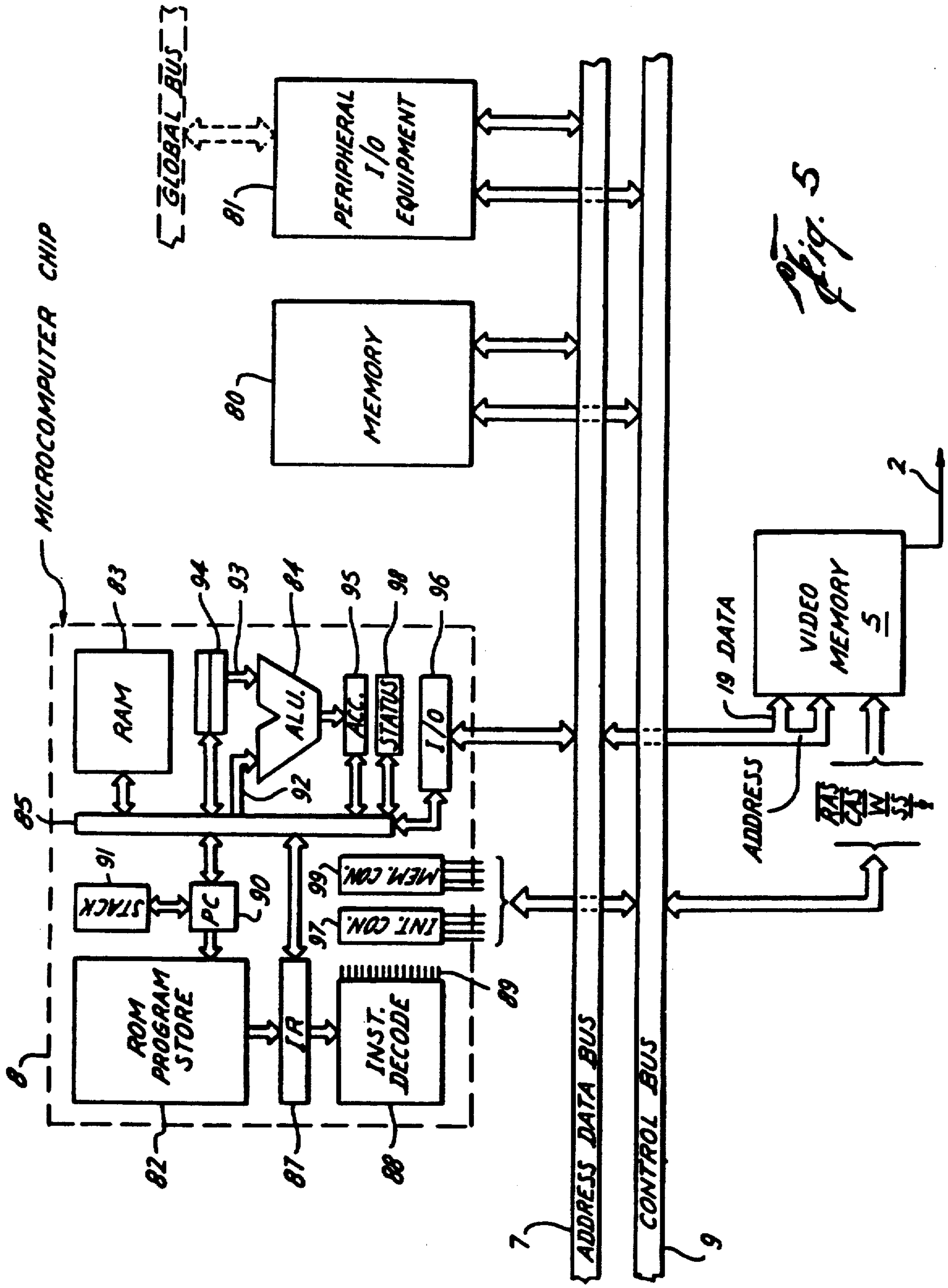
FIG. 5 is a block diagram of another portion of the system depicted in FIG. 1.

Referring to FIG. 5, a microcomputer which may be used with the system of the invention may include a single-chip microcomputer device 8 of conventional construction, along with additional off-chip program or data memory 80 (if needed), and various peripheral input/output devices 81, all interconnected by an address/data bus 7, and a control bus 9.

A single bidirectional multiplexed address/data bus 7 is shown, but instead separate address and data busses may be used, and also the program addresses and data or input and output addresses may be separated on the external busses; the microcomputer may be of the Von Neumann architecture, or of the Harvard type or a combination of the two.

The microcomputer 8 could be one of the devices marketed by Texas Instruments under the part number of TMS7000, for example, or one of the devices commercially available under part numbers Motorola 6805, Zilog Z8 or Intel 8051, or the like. These devices, while varying in details of internal construction, generally include an on-chip ROM or read-only memory 82 for program storage, but also may have program addresses available off-chip, but in any event have off-chip data access for the memory 5.

A typical microcomputer 8, as illustrated in FIG. 5, may contain a RAM or random access read/write memory 83 for data and address storage, an ALU 84 for executing arithmetic or logic operations, and an internal data and program bus arrangement 85 for transferring data and program addresses from one location to another (usually consisting of several separate busses). Instructions stored in the ROM 82 are loaded one at a time into an instruction register 87 from which an instruction is decoded in control circuitry 88 to produce controls 89 to define the microcomputer operation.

The ROM 82 is addressed by a program counter 90, which may be self incrementing or may be incremented by passing its contents through the ALU 84. A stack 91 is included to store the contents of the program counter upon interrupt or subroutine. The ALU has two inputs 92 and 93, one of which has one or more temporary storage registers 94 loaded from the data bus 85.

An accumulator 95 receives the ALU output, and the accumulator output is connected by the bus 85 to its ultimate destination such as the RAM 83 or a data input/output register and buffer 96. Interrupts are handled by an interrupt control 97 which has one or more off-chip connections via the control bus 9 for interrupt request, interrupt acknowledge, interrupt priority code, and the like, depending upon the complexity of the microcomputer device 8 and the system.

A reset input may also be treated as an interrupt. A status register 98 associated with the ALU 84 and the interrupt control 97 is included for temporarily storing status bits such as zero, carry, overflow, etc., from ALU operations; upon interrupt the status bits are saved in RAM 83 or in a stack for this purpose.

The memory addresses are coupled off-chip through the buffers 96 connected to the external bus 7 depending upon the particular system and its complexity. This path may be employed for addressing off-chip data or program memory 80 and input/output 81 in addition to off-chip video memory 5. These addresses coupled to bus 7 may originate in RAM 83, accumulator 95 or instruction register 87, as well as program counter 90. A memory control circuit 99 generates (in response to control bits 89), or responds to, the commands to or from the control bus 9 for address strobe, memory enable, write enable, hold, chip select, etc., as may be appropriate.

In operation, the microcomputer device 8 executes a program instruction in one or a sequence of machine cycles or state times. A machine cycle may be 200 nsec., for example, established by an output from a 5 MHz crystal clock applied to the microcomputer chip. So, in successive machine cycles or states, the program counter 90 is incremented to produce a new address, this address is applied to the ROM 82 to produce an output to the instruction register 87 which is then decoded in the control circuitry 88 to generate a sequence of sets of microcode control bits 89 to implement the various steps needed for loading the bus 85 and the various registers 94, 95, 96, 98, etc.

For example, a typical ALU arithmetic or logic operation would include loading addresses (fields of the instruction word) from instruction register 87 via bus 85 to addressing circuitry for the RAM 83 (this may include only a source address or both source and destination addresses). Such an operation may also include transferring the addressed data words from the RAM 83 to a temporary register 94 and/or to the input 92 of the ALU. Microcode bits 89 would define the ALU operation as one of the types available in the instruction set, such as add, subtract, compare, and, or, exclusive or, etc. The status register 98 is set dependent upon the data and ALU operation, and the ALU result is loaded into the accumulator 95.

As another example, a data output instruction may include transferring a RAM address from a field in the instruction to the RAM 83 via bus 85, transferring this addressed data from the RAM 83 via bus 85 to the output buffer 96 and thus out onto the external address/data bus 7. Certain control outputs may be produced by memory control 99 on lines of the control bus 9 such as write enable, etc. The address for this data output could be an address on the bus 7 via buffer 96 in a previous cycle where it is latched in the memory 80 or memory 5 by an address strobe output from the memory control 99 to the control bus 9.

An external memory controller device may be used to generate the $\overline{RAS}$ and $\overline{CAS}$ strobes. A two-byte address for the memory 5 would be applied to the bus 7 in two machine cycles if the bus 7 is 8-bit, or in one cycle if the bus is 16-bit.

The instruction set of the microcomputer 8 includes instructions for reading from or writing into video memory 5, the additional memory 80 or the input/output ports of peripheral equipment 81, with the internal source or destination being the RAM 83, program counter 90, temporary registers 94, instruction register 87, etc. In a microcoded processor each such operation involves a sequence of states during which addresses and data are transferred on internal bus 85 and external bus 7.

Alternatively, the invention may use a microcomputer 8 of the non-microcoded type in which an instruction is executed in one machine state time. What is necessary in selecting the microcomputer 8 is that the data and addresses, and various memory controls, be available off-chip, and that the data-handling rate be adequate to generate and update the video data within the time constraints of the particular video application.

The video memory arrangement of the invention is described in terms of one bit data paths for the bus 7, although it is understood that the microcomputer system and the memory technique is useful in either 8-bit or 16-bit systems, or other architectures such as 24-bit or 32-bit data paths and 12-bit to 16-bit addressing, in which no external memory 80 is needed and the peripheral circuitry 81 consists of merely a keyboard or like interface, plus perhaps a disc drive. A bus interface chip such as an IEEE 488 type of device could be included in the peripheral circuitry 81, for example.

Figure 6:
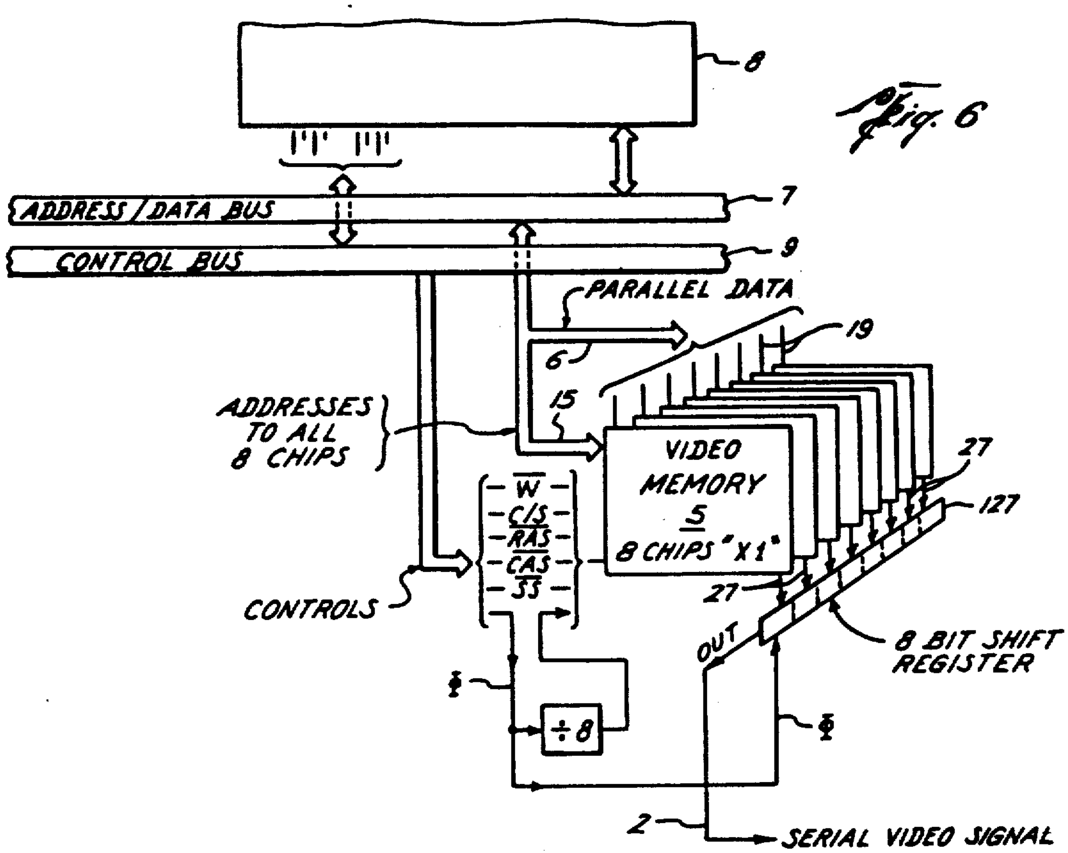
FIG. 6 is a block diagram of a further different portion of the system depicted in FIG. 1.

As illustrated in FIG. 6, the video memory 5 may be configured as eight x1 memory devices, or alternatively as one x8 device. In this embodiment eight semiconductor chip memories 5 are used, all eight being 64Kx1 or perhaps 16Kx1, each having corresponding on chip multiple serial shift registers for serial access as in FIG. 2, with one bit wide input and output. For a full color television display 1, using 8-bits per tricolor dot, a memory system consisting of four banks (eight chips per bank) of 64Kx1 memory devices would be required. Each line on the screen would use two 256-bit registers, clocked out one following the other, for each of eight video signal input lines 2 (instead of only one video data input 2 as shown).

The microprocessor 8 and bus 7 would access the 8-bit video data in parallel in a "x1" format on each chip by the eight data lines 6, one for each chip, as seen in FIG. 6. The address inputs 15 for all eight chips receive the same addresses from the bus 7, and all eight chips receive the same control inputs from bus 9. The eight serial outputs 27, one from each chip, are connected to respective bit positions of an eight-bit shift register 127.

The serial clock $\phi$ is divided by eight before application to the eight chips 5; the clock $\phi$ applied to the shift register 127 thus shifts out eight bits onto the video signal input line 2 and then another eight bits are loaded into shift register 127 from the serial shift registers 20 on the individual chips. Alternatively, instead of using the auxiliary shift register 127, the eight outputs 27 can be connected to eight parallel video signal inputs of the color TV.

For some video systems the serial data input 22 of FIG. 2 may be employed. The serial input may be video data from a receiver or a video tape playback mechanism 105 shown in FIG. 7 supplying a continuous serial video feed on line 106 to the input 22 of a chip as in FIG. 2. This incoming video data is written into the cell array 10 from the serial register 20, and while in the RAM array it is processed by the microcomputer 8 using the parallel access port 19, and then supplied to the video signal line 2 via the serial shift register 20 and the serial data output terminal 27. The invention is particularly useful in this embodiment to prevent two different bits of data from appearing on the parallel access port 19 during a random read followed by a transfer of data from the shift register 20 into the row of the array 10 being "read" by the microcomputer 8.

An example of one use of this arrangement is to add text or graphics via the microcomputer on top of video supplied from the video receiver or tape recorder 105. Another example would be to enhance or correct the video from receiver or tape 105 by writing it serially into the array 10; reading the data out in parallel to store bits temporarily in the RAM 83 of the microcomputer, performing operations via the ALU 84, then writing the corrected data back into the array 10 via bus 7, from whence it is read out serially onto the video signal input 2. For this example the $\overline{TR}$ signal may be used to block the selected random data from the data bus until the microcomputer 8 is prepared to receive the data; this may become necessary when the microcomputer receives an interrupt signal in the midst of reading the video data.

The system allows for the desired portion of the register 20 to be serially loaded at the same time it is being serially read; that is, data-in and data-out overlap as seen in FIGS. 4*d* and 4*e*. During the 128, or fewer, clock cycles used for serial-in and serial-out, the array 10 can also be accessed in parallel by microcomputer 8 for the writeover, update or correction operation.

The semiconductor memory chip containing the array 10 may also include a conventional row address counter which generates an 8-bit row address for coupling to the input of the row decoders 12 by multiplex circuitry, so the row decoder can accept an address from either the address input terminals 15 via buffers 14 or from the counter. This counter may be self-incrementing so that a count of one is added to the existing count whenever an input signal INC is received.

The counter may function as an on-chip refresh address generator as set forth in U.S. Pat. Nos. 4,207,618 and 4,344,157, or as indicated in U.S. Pat. No. 4,333,167. A column address is not needed for refresh. When a row is addressed for serial-read or serial-write, this also refreshes the data in this row; likewise, a parallel access refreshes a row upon read or write. Thus, if the video data is being sampled via serial read at the usual rates needed for TV scan then each row is not addressed within the 4 msec refresh period (60 frames/second is about 17 msec between successive samplings).

During the time between serial reads, the microcomputer 8 will probably, but not necessarily, access all rows for parallel read or write often enough for refresh. Thus, the microcomputer program in the ROM 82 could include a counter loop to send out an incremented row address and $\overline{RAS}$ at some fixed rate to assure that the refresh address specifications are met. However, to avoid occupying the microcomputer program execution with refresh overload, the counter on the chip may provide the address on-chip, and the microcomputer 8 need only apply the $\overline{RAS}$ control. That is, upon receipt of $\overline{RAS}$ and no $\overline{CAS}$, with $\overline{W}$ and $\overline{TR}$ high, the multiplex is switched to apply the contents of the counter to the row decoder 12, and $\overline{W}$ is activated to refresh a row; no serial or parallel data in or out is initiated.

An INC command (not shown) may be produced to increment the counter for the next refresh. Further, an on-chip refresh signal may be generated on chip from a timer, as in U.S. Pat. No. 4,344,157, for example. The timer produces a refresh command at least once every (4 msec.)$\times$(1/256)=16 microsec. This refresh command activates the input multiplexer, $\overline{W}$ and the INC command just as the off-chip refresh request previously discussed.

The serial input and output via register 20, in most uses such as video, will require access to sequential rows. Thus, an on chip 8-bit counter may be employed to avoid the necessity of applying a row address from the microcomputer 8 for serial access. If the sampling rate is high enough, this may be the same as the refresh counter; i.e., only one counter is needed as no separate provision for refresh is necessary.

In particular, these on-chip counters may be used to allow the microcomputer 8 to conduct other operations than "clearing" the memory array upon "power-up". That is, the microcomputer 8 need only shift the data into the shift register and then strobe the chip 5 with $\overline{RAS}$, $\overline{TR}$, $\overline{W}$, and INC signals to allow the on-chip counters to sequentially address each row in the array, to minimize occupying the microcomputer program execution with clearing overload.

Figure 8:
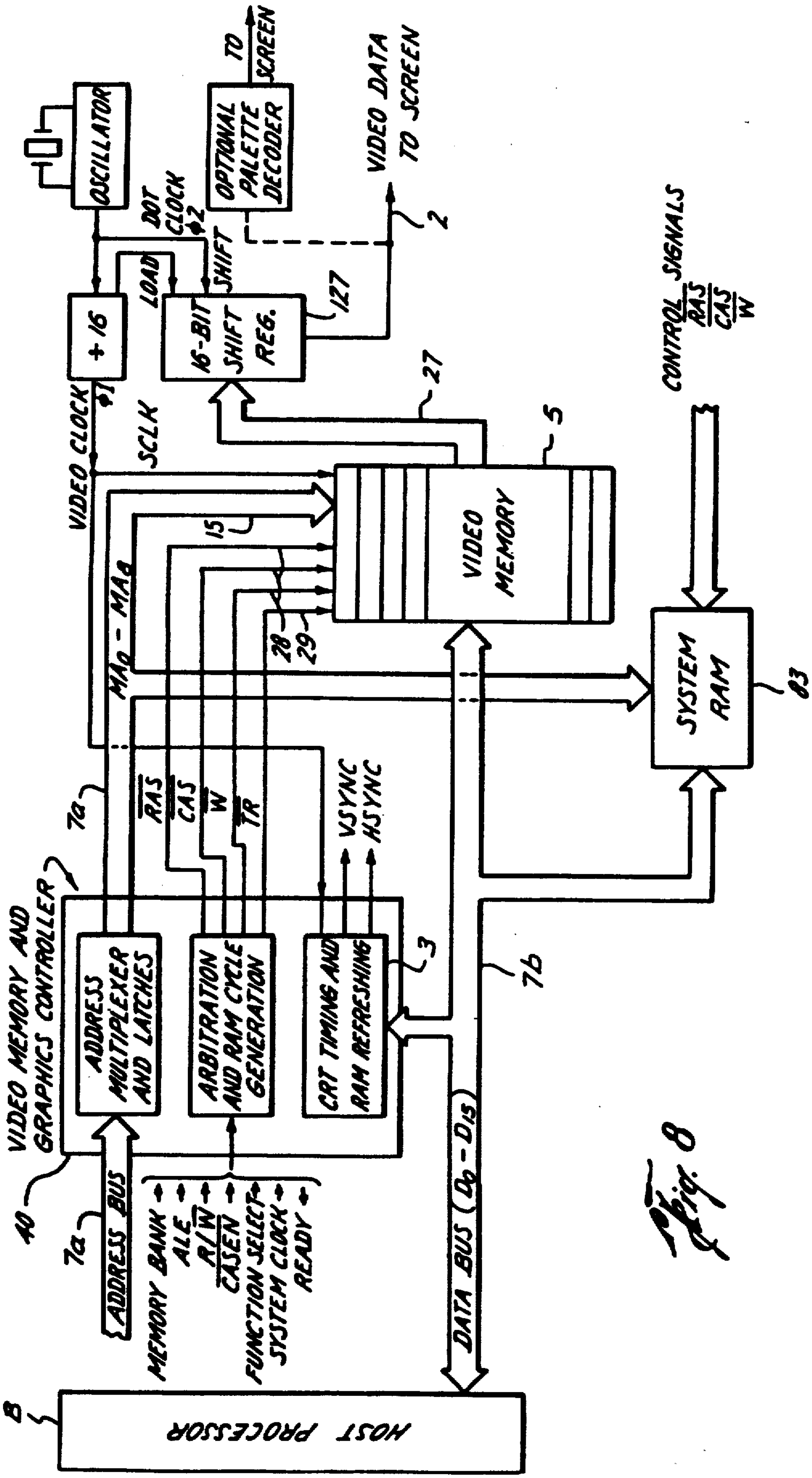
FIG. 8 is a block diagram of a further different embodiment of the system depicted in FIG. 7.

Referring now to FIG. 8, a relatively complete video graphics subsystem employing the video memory 5 of the present invention, and a memory and graphics controller 40 is depicted. The memory and graphics controller 40 would replace the conventional separate controllers needed for the video and main system memories and it may also be designed to generate the synchronization and blanking signals that are required by the display circuitry.

Each horizontal display scan is made up of an active display scan, during which data is sent out, and a retrace scan, when no data is required. During the retrace scan the serial shift registers 20 of the present invention may be reloaded from the memory array 10. The memory and graphics controller 40 could be designed with counters to keep track of the pixel and line position on the screen so that the proper address and reloading information can be sent to the device automatically during the retrace period. This controller could also be designed with enough intelligence to handle interlaced or non-interlaced displays.

The use of a device of this invention with such a graphics controller reduces the amount of external circuitry needed to control the video memory 5 and simplifies the signals the host processor 8 must generate to control the video display. Further, use of larger volume storage devices allows the use of a "standard" package of a graphics controller and video memory for CRT screens of different sizes and resolutions.

The graphics controller 40 could also be designed to "clear" the video memory upon "power-up" by generating each row address, after receiving the "clearing" data bits from the host processor 8, or could employ on-chip counters as described hereinbefore.

The shift clock $\phi$ may be generated separate from the microcomputer 8. Note that serial access and parallel access to the array 10 via register 20 and line 19 may be asynchronous; that is, the shift clock $\phi$ generator need not be synchronized with the clock of the microcomputer 8, but instead may be synchronized with the video display 1 of FIG. 1 or the video signal 106 from receiver 105 of FIG. 7.

Figure 7:
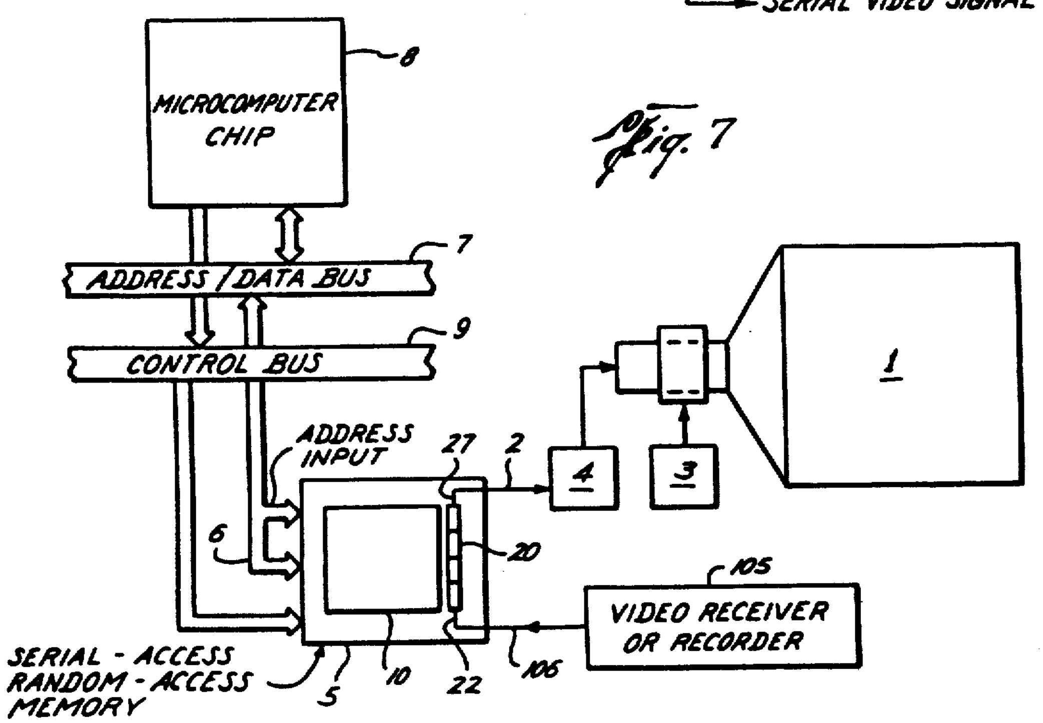
FIG. 7 is a block diagram of another different embodiment of the system depicted in FIG. 1.

A system that advantageously utilizes these features is the embodiment of FIG. 7, with serial input is an interactive home TV adapted for games, education use or catalog ordering, as examples. That is, an encoded video background is fed into serial input 22 from cable or VCR, and the user superimposes his variable added data input via microcomputer 8 (employing a keyboard, joystick, or the like coupled via peripheral input/output 81 of FIG. 5) and the resulting composite video data is applied to the screen 1 via line 2. This same video data, or alternatively only the variable added data, may be retransmitted via cable or rf to the originator for applications such as catalog ordering, bank-by-cable, educational test scoring, etc. Again, random data is blocked from the random output terminal during register transfers to avoid incorrect data appearing on the random output terminal.

Figure 9:
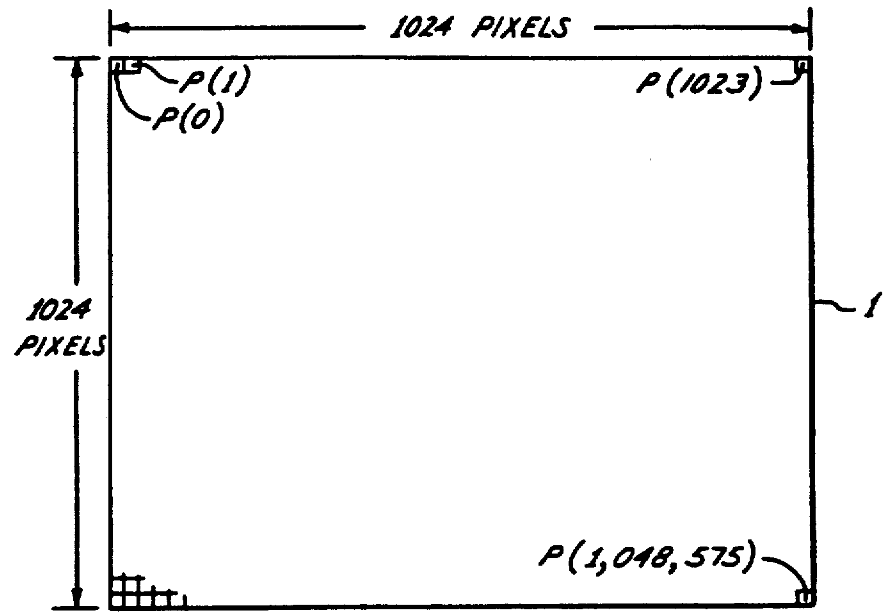
FIG. 9 is a simplified depiction of a video screen suitable for the purposes of the present invention and having 1024 by 1024 pixels.
Figure 10:
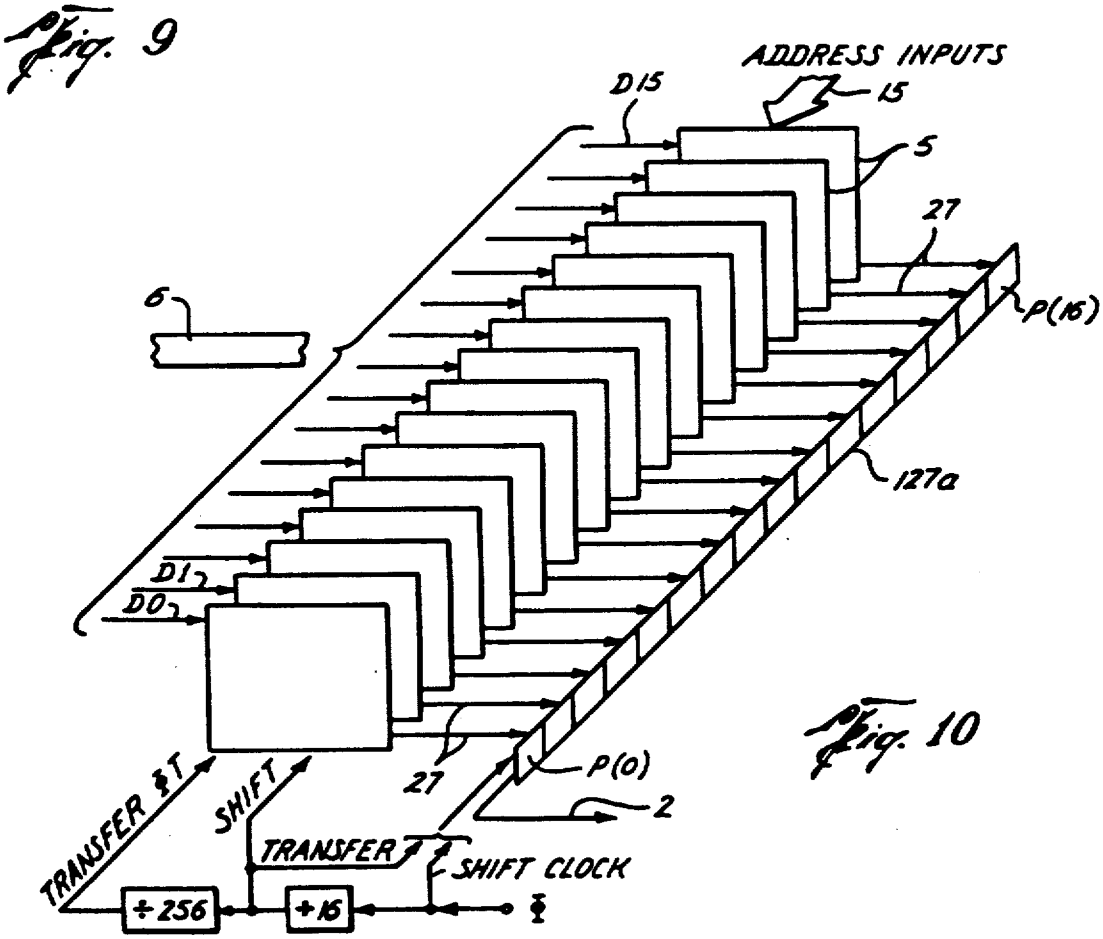
FIG. 10 is a simplified functional diagram of a portion of the system depicted in FIG. 1 according to another embodiment of the invention.

In typical video applications, the transfer of data from the array 10 into the serial shift register 20 occurs during the blanked (no data) retrace period. For a high resolution non-interlaced 1024 lines by 1024 pixels per line, simple black and white CRT screen, as depicted in FIG. 9, this will require sixteen of the 64K devices in parallel, as depicted in FIG. 10. For most applications the devices' serial shift registers 20 will feed their output in parallel into a main video shift register 127 which clocks the data out at the dot or pixel clock speed, i.e. cursor sweep speed.

For the CRT of FIG. 9 the non-interlaced pixel sweep speed or dot clock rate is 12 nsec. However, the video memories of FIG. 10 transfer their outputs to the main shift register 127 once every 16 dot clock cycles and the video memories therefore shift their data every 192 nsec, which is much slower than the serial shift register 20 speed of the device, which is about 40 nsec. Sixteen devices are selected to be used so that a standard 16 lead address and memory bus, as well as 16 bit microprocessor may be employed. However, this arrangement simplifies the controller circuitry and reduces the display memory to only sixteen parts while ensuring compatibility with a 16-bit processor. Further, by employing $\overline{TR}$ to control the release of random output data the data 6 and address 15 busses may be multiplexed to reduce circuitry and costs. Although for data storage requirements, only 4 of these 64K devices in a by 4 mode could be used, or larger volume devices in various modes could also be used.

Figure 11:
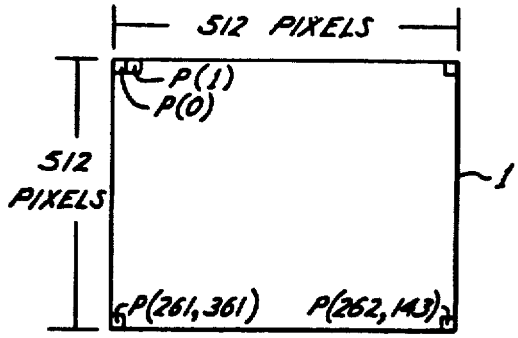
FIG. 11 is a simplified depiction of a video screen suitable for the purposes of the present invention and having 512 by 512 pixels for color presentations.
Figure 12:
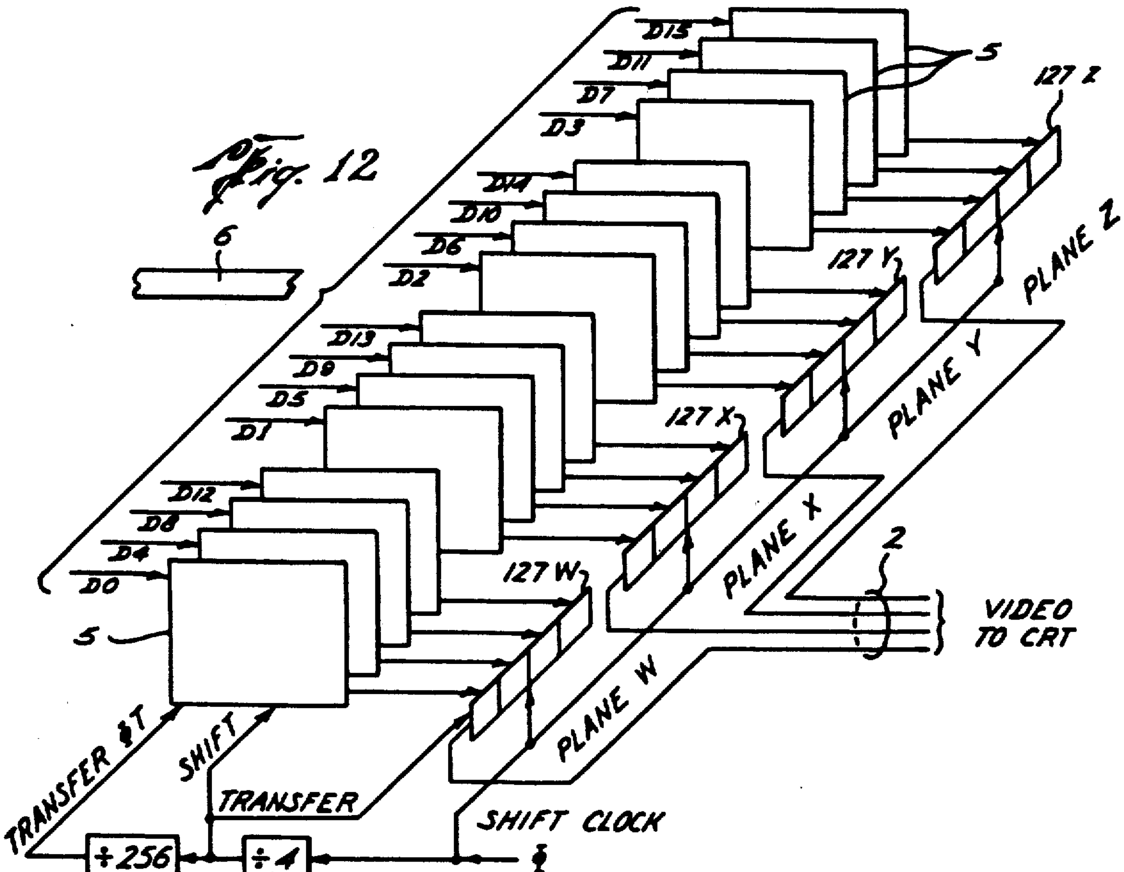
FIG. 12 is functional diagram of a portion of the system depicted in FIG. 1 according to another different embodiment of the invention.
Figure 13:
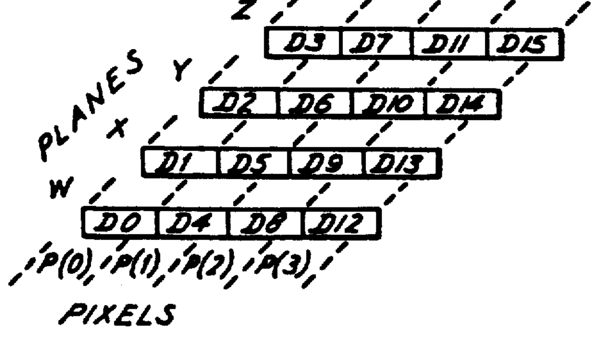
FIG. 13 is a simplified representation of the correspondence between color planes and pixels for the purpose of the structures in FIG. 12.

For a 512 lines by 512 pixels per line, four plane color system, the CRT is depicted in FIG. 11, and the arrangement of the memory devices in FIG. 12 and the correspondence of planes to pixels in FIG. 13. FIGS. 11, 12 and 13 depict a bit-mapped raster scan color graphics medium resolution system for a 512 lines by 512 pixels per line which requires 4 bits per pixel to obtain 16 color choices. The sixteen video memory devices 5 are organized as four banks or planes of four cascaded chips, with each bank or plane linked to an external 4-bit shift register 127.

On every shift out operation, the registers 127 supply one bit of the 4-bit combination necessary to describe the color of the corresponding pixel. These 4-bit words are then sent to a color look up table or other video circuitry. To do the proper pixel mappings the host processor's data bus, which sends information to the storage devices, must be reorganized to make sure that the 4-bits, coming out of the external 4-bit shift registers, correspond to the same pixel. Also note that the cycle times of the devices' on-chip serial shift registers 20 increase by a factor of four, since the 4-bit external shift registers must be reloaded every 4 pixel clock intervals, rather than the 16 pixel clock intervals of FIGS. 9 and 10. However, this speed is still within the speed limitations of the on-chip serial shift register.

The concepts of the invention are useful in communications systems other than video. For example, multiplexed voice (telephone) or digital data is transmitted serially at very high bit rates via microwave or fiber optic transmission channels. This data is similar in format to the serial video data in line 2 or line 106 in FIG. 7. Accordingly, the memory device 5 as described above is very useful in processing this type of data. The data is written into the memory 5 from the communications link by the serial, sequentially-addressed (auto increment) port, and/or read from the memory 5 to the communications link by this port. That is, the memory 5 and microcomputer 8 can be part of a receiver, a transmitter, a relay station, or a transceiver. Once in the array 10 of the memory 5, the data is accessed in parallel or random fashion by the microcomputer 8 for utilization by D-to-A converters for telephone systems, by error detection and correction algorithms, demultiplexing or multiplexing various channels, station-select, encrypting or decoding, conversion to formats for local area networks, and the like. Again, employing a device with a blocked random output during register transfers serves to prevent incorrect data from appearing in such systems.

Another use of the concepts of the invention is in a microcomputer system employing a magnetic disc for bulk storage. For example, the so-called Winchester disc provides several megabytes of storage which is accessed serially at bit rates of many megabits/second, similar to the video data rates of FIG. 7. Programs can be downloaded from disc to memory 5 in large blocks of 64K-bytes or 128-K bytes, then the microcomputer executes from the memory until a given task is completed or interrupted. The contents of memory 5 can be read out and sent to the disc storage via line 2 while another block is being written into memory 5 via input 22. The concepts of the invention also allow for exclusion of incorrect data in these systems.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

We claim:

1. An integral memory device having random and serial access capability, comprising the following elements: an internal array of rows and columns of addressable memory cells;

a plurality of address input terminals for receiving an address from external of said memory device;

address circuitry for selecting a memory cell in said array responsive to said address input terminals receiving an address;

random access input circuitry for writing externally received data to said memory cell selected by said address circuitry;

random access output circuitry for accessing the contents of said memory cell selected by said address circuitry and presenting it externally of said memory device;

a register comprised of a plurality of memory cells internal of said device;

memory transfer circuitry for transferring the contents of selected memory cells of said array into the memory cells of said register;

serial output circuitry coupled to at least one memory cell in said register for presenting the contents of said memory cell in said register to external of said device;

transfer control circuitry, responsive to a transfer control signal and internal of said device, for selectively enabling and disabling said memory transfer circuitry so that, while said memory transfer circuitry is disabled, data may be randomly written to and read from any of said memory cells in said array independently from the presentation of data by said serial output circuitry;

serial transfer circuitry responsive to a serial clock signal for transferring to said serial output circuitry the contents of another memory cell in said register so that, upon a series of said serial clock signals, the contents of a series of memory cells in said register will be presented externally of said device by said serial output circuitry; and a buffer circuit, internal of said device, coupled to said random access output circuitry and responsive to said transfer control circuitry, for selectively inhibiting said random access output circuitry from externally presenting the contents of said memory cell selected by said address circuitry during such time as said memory transfer circuitry is enabled;

wherein all of said elements are included in said integral memory device.

2. The device of claim 1, wherein said memory cells in said register are serially connected with respect to one another; and wherein said register is coupled to said serial transfer circuitry so that, responsive to said serial clock signal, the contents of each memory cell in said register is shifted to an adjacent memory cell in said register.

3. The device of claim 2, further comprising:

serial input circuitry coupled to at least one memory cell in said register, for writing data into said at least one memory cell; and wherein said memory transfer circuitry is also provided to transfer the contents of said memory cells in said register to a like number of memory cells in said array.

4. The device of claim 1, wherein said address circuitry comprises:

row address circuitry for selecting a row in said array corresponding to a row address received by said address input terminals; and column address circuitry for selecting a column in said selected row, said selected column corresponding to a column address received by said address input terminals.

5. The device of claim 4, further comprising:

address strobe circuitry, coupled to said row address circuitry and responsive to a strobe signal, for enabling said row address circuitry to select the row in said array corresponding to said row address signal being received by said row address circuitry when said strobe signal occurs; and buffer control circuitry connected to said address strobe circuitry and to said transfer control circuitry for controlling said buffer circuit to selectively inhibit said random access output circuitry responsive to said transfer control circuitry receiving said transfer control signal within a predetermined time interval relative to said address strobe circuitry receiving said strobe signal.

6. A dual-port integral memory device having random and serial access capability, comprising the following elements;

an internal array of memory cells;

a serial register, internal of said device, coupled to said array of data transfer circuitry and including a serial output coupled to a serial access output terminal;

address circuitry, receiving an address from address input terminals, for randomly selecting a single memory cell from said array for random access operation or a plurality of memory cells for serial access operation;

random access input circuitry for writing externally received data to said single memory cell selected by said address circuitry;

random access output circuitry for presenting the contents of said memory cell selected by said address circuitry to external of said device;

a transfer control circuit, coupled to a control terminal providing control signals, to select between serial access operation and random access operation, said control circuit activating said data transfer circuitry for transferring a plurality of data bits between said serial register and said array during serial access operation; and first output control circuitry internal of said device, coupled to said random access output circuitry and responsive to said control circuit for selectively inhibiting said random access output circuitry from externally presenting the contents of said single memory cell selected by said address circuitry while said data transfer circuitry is activated;

wherein all of said elements are included in said integral memory device.

7. A device according to claim 6, wherein said memory cells are one transistor dynamic memory cells.

8. A device according to claim 6, wherein said serial register comprises a serial shift register having a number of data storage locations.

9. A device according to claim 6, wherein the number of said data storage locations is equal to the number of columns of memory cells in said array of memory cells.

10. A device according to claim 6, further comprising serial clock circuitry for receiving an externally received serial clock signal to transfer a plurality of data bits serially from said serial register to said serial output terminal.

11. A device according to claim 6, further comprising:

address strobe circuitry coupled to said address circuitry and responsive to an externally received strobe signal for enabling said address circuitry to select the memory cell in said array responsive to the external address being received by said address input terminals at the time said strobe signal occurs; and second output control circuitry coupled to said address strobe circuitry and to said transfer control circuit for controlling said first output control circuitry to selectively inhibit said random access output circuitry responsive to said transfer control circuitry receiving a transfer control signal within a predetermined time interval relative to said address strobe circuitry receiving said strobe signal.

12. A data processing system comprising:

a data processing unit;

a utilization device utilizing data processed by said data processing unit; and an integral memory device for storing data and having serial and random access capability, the memory device comprising the following elements:

an internal array of memory cells;

a serial register, internal of said device, coupled to said array by data transfer circuitry and including a serial output coupled to a serial output terminal;

address circuitry, receiving an external address from address input terminals, for randomly selecting a single memory cell from said array for random access operation of selecting a plurality of memory cells for serial access operation;

random access input circuitry for writing externally received data to said single memory cell selected by said address circuitry;

random access output circuitry;

a transfer control circuit, coupled to a control terminal, for providing at least one control signal to select between serial access operation and random access operation, said transfer control circuit activating said data transfer circuitry for transferring a plurality of data bits between said serial register and said array during serial access operation; and first output control circuitry, internal of said device coupled to said random access output circuitry and responsive to said transfer control circuit for selectively inhibiting said random access output circuitry from externally presenting the contents of said single memory cell selected by said address circuitry while said data transfer circuitry is activated;

wherein all of said elements are comprised in said integral memory device.

13. The system of claim 12, wherein the memory device further comprises:

address strobe circuitry coupled to said address circuitry and responsive to an externally received strobe signal for enabling said address circuitry to select the memory cell in said array responsive to the address signal being received by said address input terminals at the time said strobe signal occurs; and second output control circuitry coupled to said address strobe circuitry and to said transfer control circuit for controlling said first output control circuitry to selectively inhibit said random access output circuitry responsive to said transfer control circuitry receiving a transfer control signal within a predetermined time interval relative to said address strobe circuitry receiving said strobe signal.

14. The system of claim 12 wherein said utilization device is a video display, said video display comprising:

an input for receiving data;

an output for presenting data in visual format;

drive circuitry for enabling a plurality of pixel locations in said visual format of said output responsive to the data received by said input;

wherein said serial output is for presenting the contents of a memory cell in said register to said input of said video display;

and wherein each pixel location in said visual format is associated with a memory cell in said array of said memory device.

15. The system of claim 13, wherein said data processing unit comprises:

a central processing unit;

a graphics processing unit, connected to said central processing unit, to said address input terminals of said memory device, and to said transfer control circuit of said memory device, for presenting said plurality of address signals and said at least one control signal to said memory device responsive to predetermined signals presented by said central processing unit;

wherein said random access input circuitry and said random access output circuitry are coupled to said central processing unit.

* * * * *